US012581883B2

(12) United States Patent
Tanaka

(10) Patent No.: US 12,581,883 B2
(45) Date of Patent: Mar. 17, 2026

(54) ETCHING METHOD AND PLASMA ETCHING APPARATUS

(71) Applicant: TOKYO ELECTRON LIMITED, Tokyo (JP)

(72) Inventor: Koki Tanaka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 398 days.

(21) Appl. No.: 18/129,628

(22) Filed: Mar. 31, 2023

(65) Prior Publication Data

US 2023/0245897 A1 Aug. 3, 2023

Related U.S. Application Data

(62) Division of application No. 17/398,601, filed on Aug. 10, 2021, now Pat. No. 11,637,020.

(30) Foreign Application Priority Data

Aug. 12, 2020 (JP) ................................. 2020-136392
Jun. 22, 2021 (JP) ................................. 2021-103362

(51) Int. Cl.
*H01L 21/311* (2006.01)
*H01J 37/32* (2006.01)
*H01L 21/3213* (2006.01)

(52) U.S. Cl.
CPC .. *H01L 21/31116* (2013.01); *H01J 37/32724* (2013.01); *H01J 37/32743* (2013.01); *H01L 21/32137* (2013.01); *H01J 37/32082* (2013.01); *H01J 2237/334* (2013.01)

(58) Field of Classification Search
CPC .......... H01L 21/31116; H01L 21/32137; H01J 37/32724; H01J 37/32743; H01J 37/32082; H01J 2237/334
See application file for complete search history.

(56) References Cited

U.S. PATENT DOCUMENTS

| | | | | |
|---|---|---|---|---|
| 6,905,800 | B1 * | 6/2005 | Yuen ................. | H01L 21/32137 257/E21.256 |
| 9,614,524 | B1 * | 4/2017 | Kawasaki ......... | H01J 37/32165 |
| 2009/0081876 | A1 * | 3/2009 | Bera ................. | H01J 37/32091 438/712 |
| 2018/0082849 | A1 * | 3/2018 | Ingle ................. | H01L 21/32137 |
| 2018/0190505 | A1 * | 7/2018 | Watanabe ......... | H01L 21/76897 |
| 2018/0286707 | A1 | 10/2018 | Hudson et al. | |
| 2020/0185250 | A1 | 6/2020 | Satoh et al. | |

FOREIGN PATENT DOCUMENTS

| | | |
|---|---|---|
| JP | H06-168914 A | 6/1994 |
| JP | H07-147273 A | 6/1995 |
| JP | 2016-122774 A | 7/2016 |
| TW | 201203351 A | 1/2012 |

* cited by examiner

*Primary Examiner* — Parviz Hassanzadeh
(74) *Attorney, Agent, or Firm* — XSENSUS LLP

(57) ABSTRACT

A plasma etching apparatus includes: a chamber; a support configured to support a substrate in the chamber; a gas supply configured to supply a processing gas into the chamber, the processing gas including hydrogen fluoride gas with a volume flow ratio of 30% or more with respect to a total flow rate of the processing gas; a plasma generator configured to generate a plasma from the processing gas in the chamber to etch the substrate with the plasma; and a cooler configured to maintain the support at 0° C. or lower during generation of the plasma.

20 Claims, 5 Drawing Sheets

FIG. 4A
FIG. 4B
FIG. 4C
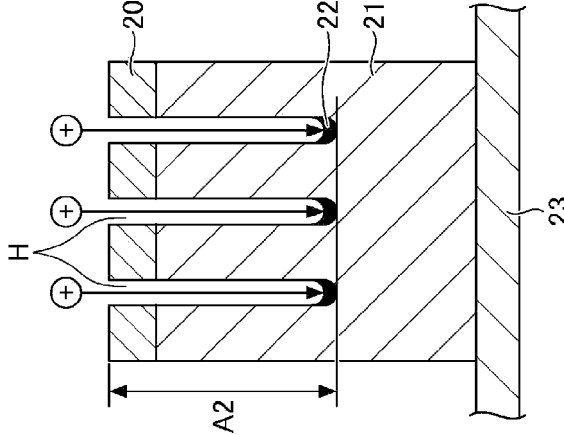
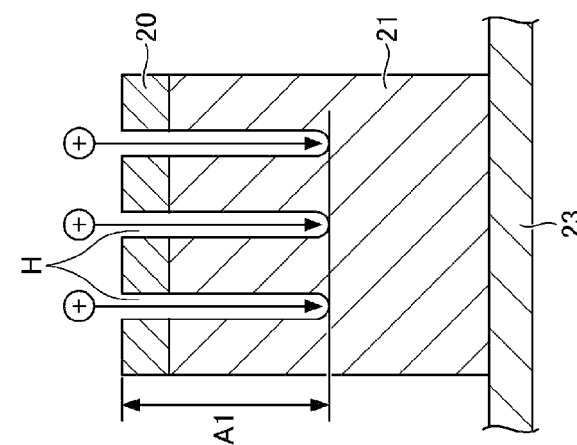

ETCHING METHOD AND PLASMA ETCHING APPARATUS

CROSS-REFERENCE TO RELATED APPLICATIONS

This application is a divisional application of U.S. patent application Ser. No. 17/398,601, filed on Aug. 10, 2021, which claims priority from Japanese Patent Application Nos. 2020-136392, filed Aug. 12, 2020 and 2021-103362, filed Jun. 22, 2021, respectively, with the Japan Patent Office, all of which are incorporated herein in their entirety by reference, and priority is claimed to each of the foregoing.

TECHNICAL FIELD

The present disclosure relates to an etching method and a plasma etching apparatus.

BACKGROUND

Japanese Patent Laid-Open Publication No. 2016-122774 discloses a technique of performing a plasma etching on a silicon oxide film which is an etching target film, in order to form a recess having a relatively high aspect ratio. In this technique, the silicon oxide film is etched by generating plasma from a processing gas that includes a fluorine-containing gas such as a fluorocarbon gas or a hydrofluorocarbon gas, and a hydrogen gas. In a structure with a relatively high aspect ratio such as a contact hole of a memory device, the aspect ratio increases, and a supply amount of an etchant decreases, as the etching is progressed.

SUMMARY

According to an aspect of the present disclosure, a plasma etching apparatus includes: a chamber; a support configured to support a substrate in the chamber; a gas supply configured to supply a processing gas into the chamber, the processing gas including hydrogen fluoride gas with a volume flow ratio of 30% or more with respect to a total flow rate of the processing gas; a plasma generator configured to generate a plasma from the processing gas in the chamber to etch the substrate with the plasma; and a cooler configured to maintain the support at 0° C. or lower during generation of the plasma.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 3A to 3C are views illustrating a flow of an etching of an etching target film.

FIGS. 4A to 4C are views illustrating the flow of the etching of the etching target film.

DETAILED DESCRIPTION

Figure 1:
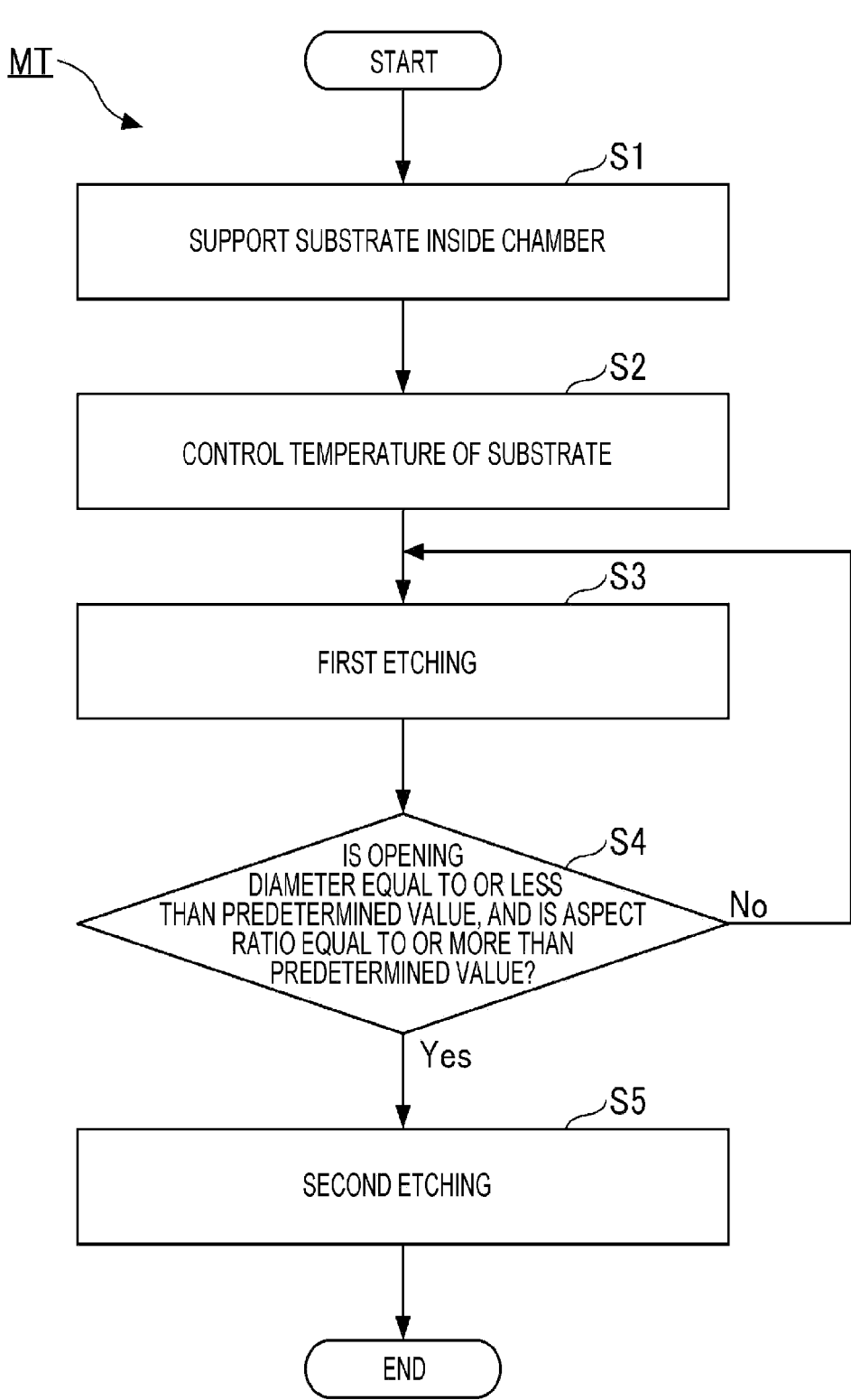
FIG. 1 is a view illustrating an etching method according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An embodiment of the present disclosure provides a method of etching a film. The method includes: (a) providing a substrate that contains silicon, on a support; (b) etching the substrate with plasma generated from a first gas that includes a fluorine-containing gas, to form an etching shape having a bottom; (c) generating plasma from a second gas that includes a hydrogen fluoride (HF) gas, to selectively form a condensed or solidified layer of HF at the bottom of the etching shape; and (d) etching the bottom with the plasma generated from the second gas, by supplying a bias power to the support. During (c) and (d), a temperature of the substrate may be maintained to be 0° C. or lower. According to this embodiment, an etchant is efficiently supplied to the bottom of the etching shape, so that the etching rate may be improved.

In the embodiment, (c) and (d) may be repeated. Further, in the embodiment, (c) and (d) may be performed at the same time.

In the embodiment, (c) and (d) may be performed when an opening diameter of the etching shape is 200 nm or less, and an aspect ratio is 20 or more.

In the embodiment, after (a), the temperature of the substrate may be set to −40° C. or lower.

In the embodiment, (d) may etch the bottom with the plasma generated from the second gas or plasma generated from a rare gas.

In the embodiment, the etching may be performed by supplying a bias power to attract ions in the plasma generated from the second gas to the bottom, and causing the condensed or solidified layer that has been formed at the bottom to react with the bottom.

Another embodiment of the present disclosure provides a method of etching a film. The method includes: providing a substrate that contains silicon, on a support inside a chamber; setting a temperature of the substrate to 0° C. or lower; supplying a mixed gas that includes a hydrogen fluoride (HF) gas with a volume flow ratio of 30% or more with respect to a total flow rate of a processing gas into the chamber; and etching the substrate with plasma generated from the mixed gas, by supplying a radio-frequency power. During the supplying and the etching, the temperature of the substrate may be maintained to be 0° C. or lower. According to this embodiment, the etching rate may be improved.

In the embodiment, the setting may set the temperature of the substrate to −40° C. or lower, and during the supplying and the etching, the temperature of the substrate may be maintained to be 0° C. or lower.

In the embodiment, the substrate that contains silicon may include a silicon oxide film or a silicon nitride film.

In the embodiment, the substrate that contains silicon may include a stacked film of a silicon oxide film and a silicon nitride film.

In the embodiment, the substrate that contains silicon may include a stacked film of a silicon oxide film and polysilicon.

Yet another embodiment of the present disclosure provides a plasma etching apparatus that includes: a chamber; a support provided inside a chamber and configured to support a substrate; a plasma generator configured to generate plasma inside the chamber; and a controller. The controller performs (a) receiving a substrate that contains silicon, and supporting the substrate on the support; (b) etching the substrate with plasma generated from a first gas that includes a fluorine-containing gas, to form an etching shape having a bottom; (c) generating plasma from a second gas that includes a hydrogen fluoride (HF) gas, to selectively form a condensed or solidified layer of HF at the bottom of the etching shape; and (d) etching the bottom with the plasma generated from the second gas, by supplying a bias power to the support. During (c) and (d), the controller may maintain a temperature of the substrate to be 0° C. or lower.

Hereinafter, an embodiment for implementing the present disclosure will be described with reference to the drawings. In the respective drawings, the same components and parts may be denoted by the same reference numerals, and over-lapping descriptions thereof may be omitted.

In the following descriptions, the power supplied from one of the two radio-frequency power supplies (RF power supplies) in FIG. 5 into a plasma etching apparatus will also be referred to as an HF power, and the power supplied from the other to a lower electrode in the plasma etching appa-ratus will also be referred to as an LF power (also referred to as a bias power). The HF power is a plasma generation radio-frequency power that mainly contributes to the gen-eration of plasma. The LF power is a bias radio-frequency power that mainly contributes to the attraction of ions into a substrate W. Here, the substrate W which is a processing target is a wafer having a diameter of 300 mm. The tem-perature of the substrate W may be controlled by measuring the temperature of the front surface of the substrate W with a temperature sensor attached to the front surface of the substrate W via an adhesive such as silicone gel. Further, in the descriptions herein, a mixed gas refers to a gas in which two or more types of gases are mixed (etching gas).

In the present embodiment, a method MT of etching the substrate will be described with reference to FIG. 1. In addition to FIG. 1, FIG. 5 will also be referred-to in the following descriptions. Hereinafter, the method MT will be described by taking a case where the method MT is applied to the substrate W using a plasma etching apparatus 10 as an example. The method MT includes steps S1 to S5. Further, step S5 includes at least steps S51 to S53 of FIG. 2.

Figure 5:
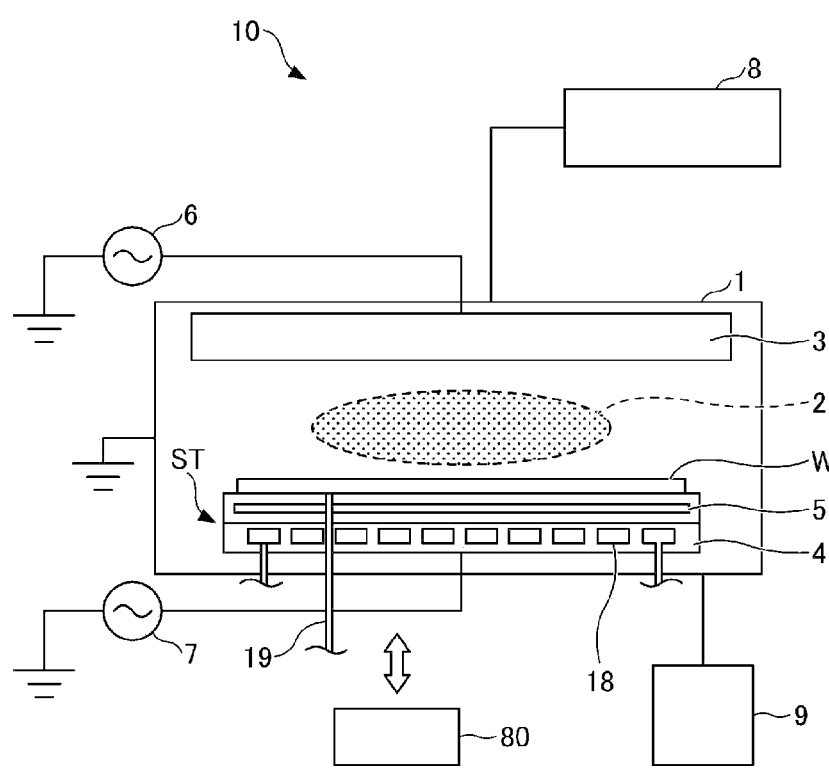
FIG. 5 is a schematic cross-sectional view illustrating an example of a plasma etching apparatus according to an embodiment.

In step S1, the substrate W that includes an etching target film is supported by a support ST inside a chamber 1 as illustrated in FIG. 5. The support ST includes an electrostatic chuck 5, and holds the substrate W by an electrostatic force. The etching target film is a silicon-containing film. The silicon-containing film includes a silicon oxide film ($SiO_2$) or a silicon nitride film (SiN). Further, the silicon-containing film may include a silicon-containing film other than the silicon oxide film. The silicon-containing film may contain two or more types of silicon-containing films. The two or more types of silicon-containing films may include a stacked film of a silicon oxide film and a polysilicon film, or a stacked film of a silicon oxide film and a silicon nitride film. The present embodiment describes an example where a silicon oxide film is etched as an etching target film. For example, the embodiment may be used for an etching shape with an aspect ratio of 20 or more for a 3D-NAND or a DRAM.

The substrate W may further include a mask having an opening on the etching target film. The mask may be formed of various films of which selectivity is obtained with respect to the silicon-containing film that is the etching target film. The mask may be a carbon-containing film. Examples of the carbon-containing film include photoresist or amorphous carbon. The mask may be a silicon-containing film, and may be, for example, a polysilicon mask.

A gas that includes a fluorine-containing gas is used for the etching. The gas that includes the fluorine-containing gas may be fluorocarbons such as $CF_4$, $C_2F_6$, $C_4F_6$, and $C_4F_8$, hydrofluorocarbons such as $CH_3F$, $CH_2F_2$, and $CHF_3$, gases such as $SF_6$ and $NF_6$, hydrogen fluoride (HF) gas, or a combination of one or more gases selected therefrom. The gas that includes the fluorine-containing gas may further include a hydrogen-containing gas. The hydrogen-contain-ing gas may be, for example, $H_2$ or $CH_4$. In addition to these gases, a rare gas such as Ar may be included. Since fluorine ions and hydrogen ions in plasma generated from the gas that includes fluorine or the gas that includes fluorine and hydrogen are light, the fluorine ions and the hydrogen ions are unlikely to damage the mask. Accordingly, a relatively high mask selectivity may be obtained. As an example, when the aspect ratio is a predetermined value (e.g., 20) or more, a mixed gas that includes hydrogen fluoride gas is used as the etching gas. The mixed gas that includes hydrogen fluoride gas may include the hydrogen fluoride gas with a 30% or more volume flow ratio with respect to the total flow rate of the mixed gas (processing gas). In this example, aspect ratios A1 to A3 are calculated without including the mask. As illustrated in FIGS. 4A to 4C, the aspect ratios A1 to A3 may be calculated including the mask. It may be preferable to determine the aspect ratio at which a con-densed layer or a solidified layer of hydrogen fluoride to be described later is formed.

The mask on the silicon-containing film may be a metal-containing mask. The metal-containing mask may be formed of a tungsten (W)-based, titanium (Ti)-based, molybdenum (Mo)-based, ruthenium (Ru)-based, hafnium (Hf)-based or aluminum (Al)-based material.

Next, in step S2, the temperature of the substrate is controlled to 0° C. or lower. For example, the temperature of the substrate (the temperature of the support ST) is set to −40° C. or lower before the start of the etching (the temperature of the substrate before the start of the etching is substantially identical to the temperature of the support ST before the start of the etching). When the temperature of the substrate is controlled to 0° C. or lower, for example, −40° C. or lower, the supply of an etchant to the bottom of an etching shape is accelerated so that the etching rate may be improved. Further, the temperature of the substrate before the start of the etching may be set to −70° C. or lower. The temperature of the substrate may be adjusted by cooling the support ST using a cooler or by causing a refrigerant such as liquid nitrogen or chlorofluorocarbon to flow through the support ST. In consideration of heat input by plasma, the temperature of the refrigerant caused to flow through the support ST is set to a temperature 10° C. to 50° C. lower than a target temperature of the substrate, during the etching. In an example, a refrigerant of −120° C. to −40° C. is supplied to a flow path 18 inside the support ST. In an embodiment, the target temperature of the substrate is preset to a specific temperature which is equal to or lower than 0° C. In addition to supplying the refrigerant to the support ST, a heat transfer gas may be supplied from a heat transfer gas pipe 19 of the support ST to the space between the front surface of the electrostatic chuck 5 and the back surface of the substrate W held on the electrostatic chuck 5. By controlling the pressure of the heat transfer gas supplied between the front surface of the electrostatic chuck 5 and the back surface of the substrate W, the heat conduction is controlled, so that the temperature of the substrate may be adjusted. An inert gas may be used as the heat transfer gas. As an example, a rare gas, for example, helium gas may be used. As a result, in an embodiment, the temperature of the substrate W may be controlled to a temperature of 0° C. or lower during the etching. Further, when the temperature of the substrate W is relatively low, the supply of the etchant is accelerated.

Next, in step S3, the substrate W is etched. The etching in step S3 will be referred to as a "first etching." In step S3, the gas that includes the fluorine-containing gas may be supplied as the etching gas from a gas source 8 into the chamber, and a plasma generation radio-frequency power of 27 MHz to 100 MHz may be supplied from an RF source 6 to an upper electrode 3, so as to generate plasma from the etching gas. In another example, the plasma generation radio-frequency power may be supplied from the RF source 6 to the support base ST (lower electrode). The magnitude of the radio-frequency power supplied from the RF source 6 may be, for example, 0.1 kW to 5 kW. Further, the etching may be performed while supplying a bias power of 200 kHz to 13.56 MHz from an RF source 7 to the support ST (lower electrode). The magnitude of the bias power may be 5 kW or more. Without being limited to the radio-frequency power, a voltage pulse may be used. In an example, a direct current (DC) voltage pulse may be applied. The gas supplied into the chamber during step S3, that is, the gas that includes the fluorine-containing gas is an example of a "first gas."

Figures 3A, 3B, 3C:
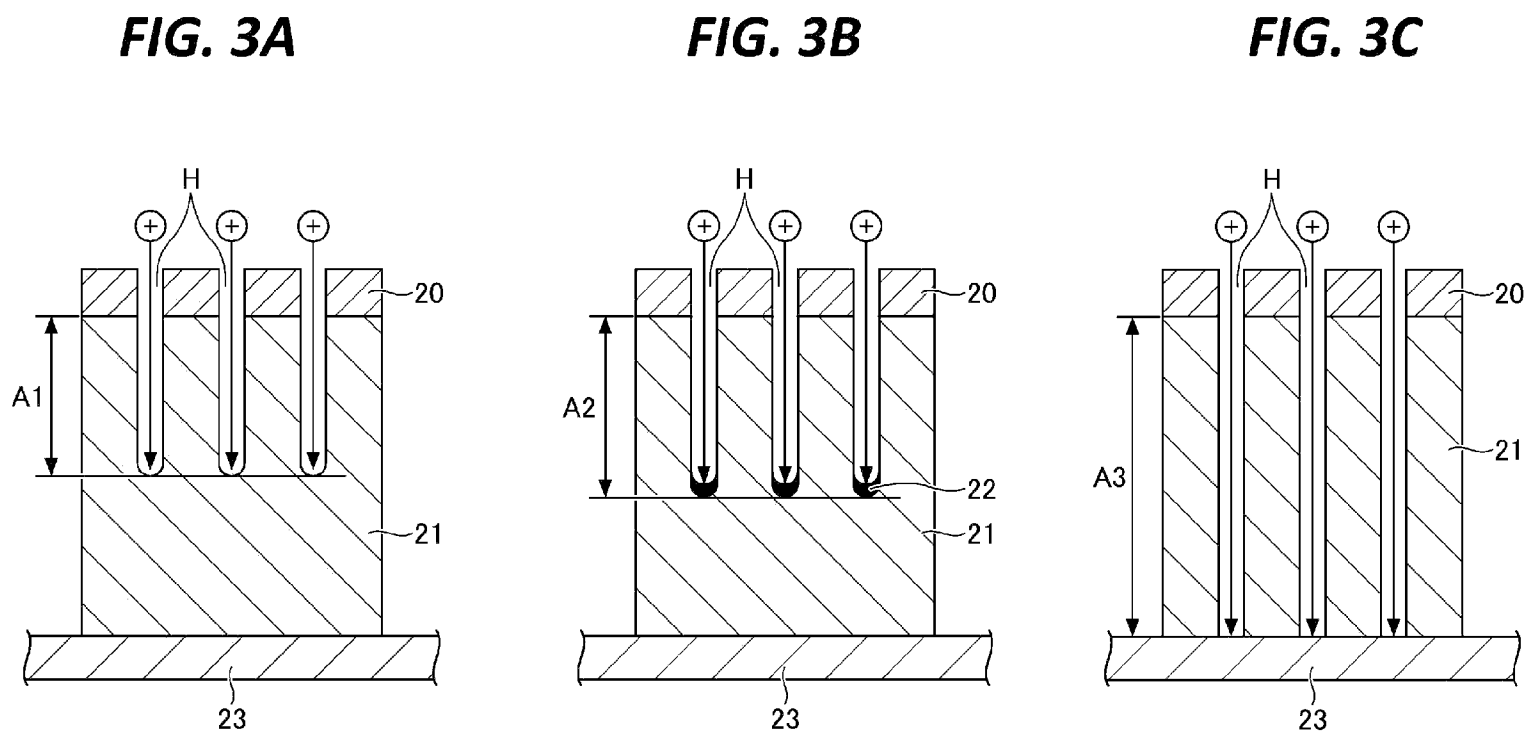

Fluorocarbon gas (e.g., $CF_4$) may be used as the etching gas. Further, a hydrogen-containing gas (e.g., $H_2$ gas) may be supplied. Further, a rare gas may be added. When the etching target film includes a silicon nitride film, fluorocarbon or hydrofluorocarbon gas (e.g., $CHF_3$) may be used as the etching gas. The plasma generation radio-frequency power is not limited to a continuous wave, and may be a pulse wave having a predetermined duty ratio (which is defined by ON-time/(ON-time+OFF-time)). The duty ratio may be changed during the etching. In step S3, the substrate W is etched with the plasma generated from the gas that includes the fluorine-containing gas, so as to form an etching shape having a bottom. As a result, as illustrated in FIG. 3A, ions and radicals in the plasma act to etch an etching target film 21 via a mask 20. In FIGS. 3A to 3C, an example of the etching shape includes a hole H and a line shape. In the first etching, for example, the etching is performed to reach a depth A1 having an aspect ratio of about 20.

Next, in step S4, it is determined whether the opening diameter of the etching shape is equal to or less than a predetermined value, and the aspect ratio is equal to or more than a predetermined value. For example, it is determined whether the opening diameter of the etched shape is 200 nm or less, and the aspect ratio is 20 or more. Here, the predetermined value of the aspect ratio may be any value as long as a condensed or solidified layer 22 of hydrogen fluoride may be formed at the bottom of the recess as illustrated in FIG. 3B. In an embodiment, the aspect ratio (or the opening diameter) may be measured by an optical means provided inside or outside the chamber.

When the opening diameter of the etching shape is larger than the predetermined value (e.g., 200 nm), or when the aspect ratio is less than the predetermined value (e.g., 20), the process returns to step S3 to continue the first etching. Meanwhile, when the opening diameter of the etching shape is equal to or less than the predetermined value (e.g., 200 nm) and when the aspect ratio is equal to or more than the predetermined value (e.g., 20), the process proceeds to step S5. In step S4, it may be determined whether a predetermined time has elapsed since the start of the first etching, instead of performing the determination described above. In this case, the process returns to step S3 to continue the first etching until the predetermined time elapses. Meanwhile, after the predetermined time elapses, the process proceeds to step S5.

Next, in step S5, the substrate W is continued to be etched. The etching in step S5 will be referred to as a "second etching." The first etching and the second etching are continuous etchings performed on the same etching target film. In another example, the second etching may be performed after the first etching, and another step may be performed between the first etching and the second etching. In step S5, an etching gas that includes hydrogen fluoride (HF) gas is supplied as an etching gas into the chamber from the gas source 8. When the gas used in step S3 includes the hydrogen fluoride gas, the etching gas supplied in step S5 may be the same as the gas supplied in step S3, that is, the gas that includes the fluorine-containing gas. When the gases are the same, it is unnecessary to switch the gas in step S5, so that the throughput is improved. The etching gas supplied into the chamber in step S5, that is, the gas that includes the hydrogen fluoride is an example of a "second gas."

In another example, when the hydrogen fluoride gas is included in step S3, the flow rate of the hydrogen fluoride gas supplied in step S5 may be larger than the flow rate of the hydrogen fluoride gas supplied in step S3. The mixed gas supplied in step S5 and the gas supplied in step S3 may include different gases. When the hydrogen fluoride gas is included in step S3, the flow rate ratio of the hydrogen fluoride gas supplied in step S5 to the other gas included in the mixed gas may be higher than the flow rate ratio of the hydrogen fluoride gas supplied in step S3 to the other gas of the mixed gas. As a result, hydrogen fluoride may be sufficiently supplied to the bottom of the etching shape even when the aspect ratio is high.

As to other process conditions in step S5, for example, a plasma generation radio-frequency power of 27 MHz to 100 MHz may be supplied from the RF source 6 to the upper electrode 3, so as to generate plasma from the etching gas. The plasma generation radio-frequency power may be supplied from the RF source 6 to the support ST (e.g., the lower electrode). The etching gas may be a mixed gas of two or more types of gases that include hydrogen fluoride (HF) gas. As the mixed gas, the two or more types of gases may be individually supplied to and mixed in the chamber 1, or may be mixed before being supplied to the chamber 1. In an example, the frequency of the radio-frequency power supplied from the RF source 6 may be 0.1 kW to 5 kW. Further, the etching is accelerated by supplying a bias power of 200 kHz to 13.56 MHz from the RF source 7 to the support ST. The magnitude of the bias power may be 5 kW or more. The bias power is not limited to the radio-frequency power, and may be a voltage pulse such as a DC pulse.

The gas supplied in step S5 may include at least one of fluorocarbon gas, hydrofluorocarbon gas, and other halogen-containing gases, in addition to the hydrogen fluoride gas. Examples of the fluorocarbon gas include $CF_4$, $C_3F_8$, $C_4F_6$, $C_4F_8$, and $C_5F_8$. Examples of the hydrofluorocarbon gas include $CH_3F$, $CH_2F_2$, and $CHF_3$. The other halogen-containing gases may include $Cl_2$ and/or HBr. In addition, $SF_6$ and $NF_3$ may be included. The fluorocarbon gas or the hydrofluorocarbon gas protects the mask.

The etching gas used in step S5 may further include a hydrogen-containing gas (e.g., $H_2$ gas). Further, a rare gas may be included. When the etching target film includes a silicon nitride film, fluorocarbon or hydrofluorocarbon gas (e.g., $CHF_3$) may be used as the etching gas. The plasma generation radio-frequency power is not limited to a continuous wave, and may be a pulse wave having a predetermined duty ratio. The duty ratio may be changed during the etching.

Figure 2:
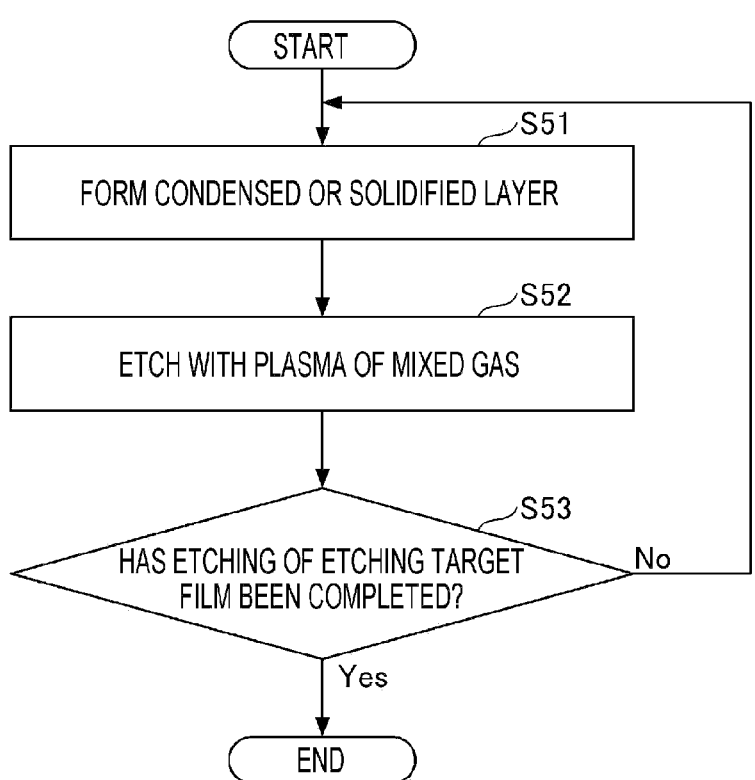
FIG. 2 is a view illustrating a flow of a second etching according to an embodiment.

Step S5 includes at least steps S51 to S53 illustrated in FIG. 2. In step S51, the substrate W is etched with the plasma generated from the mixed gas that includes the hydrogen fluoride gas, so as to selectively form a condensed or solidified layer of hydrogen fluoride at the bottom of the etching shape.

In an etching shape with a predetermined opening diameter or less and a predetermined aspect ratio or more, for example, the etching shape with the opening diameter of 200 nm or less and the aspect ratio of 20 or more, the pressure at the bottom becomes higher than that of the vapor phase due to an etching by-product volatilized from the bottom, so that hydrogen fluoride is easily condensed or solidified. When hydrogen fluoride is condensed, the capillary condensation phenomenon occurs, and thus, hydrogen fluoride is selectively adsorbed to the bottom. Even when hydrogen fluoride is not cohered, the polarization of hydrogen fluoride molecules generates the cohesive force among the respective hydrogen fluoride molecules, so that hydrogen fluoride is selectively adsorbed to the bottom where the surface energy is the smallest.

During the etching, the temperature of the substrate increases due to the heat input from the plasma. Then, the temperature of the substrate is controlled by adjusting the pressure of the heat transfer gas supplied between the back surface of the substrate and the front surface of the support, so that the temperature of the substrate is maintained to be 0° C. or lower even during the etching. That is, the temperature of the substrate is maintained to be 0° C. or lower during the step of supplying the etching gas that includes the hydrogen fluoride gas into the chamber 1 and the step of supplying the plasma generation radio-frequency power to etch the substrate W with the plasma generated from the etching gas.

As to the method of maintaining the temperature of the substrate to be 0° C. or lower, for example, the pressure of the heat transfer gas supplied between the substrate W and the electrostatic chuck 5 may be controlled, and/or the magnitude of the bias power may be controlled, during the etching. As a result, after the etching shape reaches the predetermined opening diameter or less and the predetermined aspect ratio or more, for example, the opening diameter of 200 nm or less and the aspect ratio of 20 or more, the flow rate of the hydrogen fluoride gas is adjusted, so that a liquid-phase condensed layer or a solid-phase solidified layer in which hydrogen fluoride is condensed may be selectively formed at the bottom of the etched shape. The condensed or solidified layer is formed in the manner that hydrogen fluoride which functions as an etchant is preferentially physically adsorbed to the bottom of the etching shape. According to the method MT, the etching rate may be maintained or improved by the condensed or solidified layer, even after the etching is progressed to a depth where the aspect ratio is a predetermined value or more, for example, 20 or more.

FIG. 3A represents the etching of the hole H with the etching depth A1 where the aspect ratio is less than a predetermined value, for example, 20 (the first etching).

FIG. 3B represents the etching of the hole H with the etching depth A2 (>A1) where the aspect ratio is a predetermined value or more (the second etching). In the second etching, the hole H becomes deeper, and thus, the condensation or solidification phenomenon occurs. By using the phenomenon, the etchant of the hydrogen fluoride gas is efficiently supplied to the bottom of the etching shape, so that the condensed or solidified layer 22 of hydrogen fluoride is selectively formed at the bottom of the etching shape.

In step S51, when the flow rate of the hydrogen fluoride gas is excessively large, the opening of the etching shape is clogged, and the etching is stopped. Thus, by controlling the hydrogen fluoride gas at a predetermined flow rate, and further, controlling the temperature of the substrate to 0° C. or lower, the condensed or solidified layer is selectively formed at the bottom of the etching shape as a result of the condensation or solidification phenomenon, so that the etching is accelerated.

In step S52 subsequent to step S51 illustrated in FIG. 2, the bias power is supplied to the support ST, such that the ions in the plasma generated from the mixed gas reach the bottom of the etching shape. Then, the condensed or solidified layer 22 of hydrogen fluoride reacts with the etching target film by the energy of the ions, so that the etching of the etching target film is accelerated. As a result, as illustrated in FIG. 3B, an anisotropic etching is performed on the etching target film 21.

In particular, in step S52, the bias power is applied to the support ST, thereby controlling the ions to reach the condensed or solidified layer 22. As a result, the etching is accelerated via the condensed or solidified layer 22 that functions as the etchant, so that the etching rate may be improved.

In step S53, it is determined whether the etching of the etching target film has been completed. For example, it may be determined that the etching has been completed, at the timing when a base film 23 of the etching target film 21 is exposed as illustrated in FIG. 3C. The exposure of the base film 23 may be determined by using, for example, an end point detection technique. However, the method of determining whether the etching has been completed is not limited thereto.

When it is determined in step S53 that the etching has not been completed, the process returns to step S51, and steps S51 and S52 are repeated. During the repetition of steps S51 and S52, the temperature of the substrate is maintained to be 0° C. or lower. When it is determined in step S53 that the etching has been completed, the method MT is ended.

In the method MT described above, step S51 for forming the condensed or solidified layer 22, and step S52 for performing the etching with plasma generated from the mixed gas are described as different steps. However, the steps may be performed at the same time. Steps S51 and S52 may be repeated. Without being limited to a case where steps S51 and S52 are repeated in an order, the etching with the plasma generated from the mixed gas may be simultaneously performed, while the condensed or solidified layer 22 is formed. When steps S51 and S52 are performed at the same time, the etching throughput is improved.

The gas used for the second etching, that is, the mixed gas that includes the hydrogen fluoride gas may include a rare gas. Examples of the rare gas include argon gas and helium gas. The rare gas contributes to the acceleration of the etching by the action of the ions (e.g., argon ions) in the plasma during the second etching. That is, in the second etching, the bias power is supplied to the support ST, such that the ions in the plasma are attracted to the bottom of the etching shape. As a result, the condensed or solidified layer 22 formed at the bottom of the etching shape reacts with the bottom of the etching shape by the energy of the ions, so that the etching is progressed. However, the ions that apply energy to the condensed or solidified layer 22 so as to contribute to the acceleration of the etching are not limited to the ions of the rare gas. Various ions in the plasma generated from the mixed gas that includes the rare gas may be attracted into the substrate W, thereby applying energy to the condensed or solidified layer 22, so that the etching may be progressed. The gas used for the first etching may include the rare gas, so that plasma is stably generated.

Steps S51 and S52 may be repeated in the manner that in step S51, the mixed gas that includes hydrogen fluoride is supplied to form the condensed or solidified layer 22, and in step S52, the type of the gas is switched from the mixed gas to the rare gas to perform the etching while supplying the rare gas. However, the mixed gas may include the rare gas, and steps S51 and S52 may be performed using the same gas type.

[Plasma Etching Apparatus]

A plasma etching apparatus described herein below may be used for the method

MT described above. FIG. 5 is a schematic cross-sectional view illustrating an example of the plasma etching apparatus 10 according to an embodiment. The plasma etching apparatus 10 is an example of some plasma generation systems used for exciting plasma from a processing gas.

FIG. 5 illustrates a capacitively coupled plasma (CCP) apparatus, in which plasma 2 is formed between the upper electrode 3 and the support ST in the chamber 1. The support ST includes the lower electrode 4 and the electrostatic chuck 5. The substrate W is held on the support ST. The RF sources 6 and 7 are connected to the upper electrode 3 and the lower electrode 4, respectively, and may use different RF frequencies. In another example, the RF sources 6 and 7 may be connected to the same electrode. Further, a direct current (DC) power may be connected to the upper electrode. The gas source 8 is connected to the chamber 1 to supply a processing gas. Further, an exhaust device 9 is connected to the chamber 1 to exhaust the inside of the chamber 1. A temperature sensor may be provided to measure the temperature of the substrate in a non-contact manner.

The plasma etching apparatus of FIG. 5 includes a controller 80 that includes a processor and a memory, and the controller 20 controls each component of the plasma etching apparatus 10 to process the substrate W with plasma.

EXAMPLES

Below are examples of process conditions for each step in the method MT according to the embodiment.

<First Etching (S3 of FIG. 1)>
Target film: SiO$_2$ film (aspect ratio of less than 20)
HF power: 0.1 kW to 5 kW, 27 MHz to 100 MHz
LF power: 5 kW or more, 200 kHz to 13.56 MHz
First gas: Mixed gas that includes fluorine-containing gas (e.g., CF$_4$ gas and Ar gas)
Substrate temperature: 0° C. or lower
Pressure in the space between the back surface of the substrate and the electrostatic chuck: 10 Torr to 200 Torr (1,333 Pa to 26,665 Pa)

<Second Etching (S5 of FIG. 1)>
Target film: SiO$_2$ film (aspect ratio of 20 or more)
(Condensed layer forming step (S51 of FIG. 2) and etching step (S52 of FIG. 2))
HF power: 0.1 kW to 5 kW, 27 MHz to 100 MHz
LF power: 5 kW or more, 200 kHz to 13.56 MHz
Second gas: Mixed gas that includes fluorine-containing gas (e.g., HF gas and Ar gas)
Substrate temperature: 0° C. or lower Pressure in the space between the back surface of the substrate and the electrostatic chuck: 10 Torr to 200 Torr As described above, according to the etching method of the present embodiment, the etching may be accelerated.

Steps S3 and S4 of FIG. 1 may not be performed. For example, the substrate W in which a recess having a predetermined aspect ratio is already formed may be prepared (step S1), and the second etching of step S5 may be performed while controlling the temperature of the substrate (step S2). The aspect ratio referred-to here may be an aspect ratio calculated including the opening formed in the mask as illustrated in FIGS. 4A to 4C (FIGS. 4A to 4C represent the depths A1 to A3 of the recesses including the mask). When the aspect ratio of the mask opening is equal to or more than the aspect ratio at which the condensed or solidified layer is formable, step S3 may be omitted. The predetermined aspect ratio indicates an aspect ratio at which the condensed or solidified layer is formable in an etching target region (the bottom of a recess or the surface of an etching target film), and steps S3 and S4 may be omitted when a substrate in which the shape having the aspect ratio is formed is provided.

The embodiment further includes the following aspects (A1) and (A2).

(A1) An etching method, comprising
(a) providing a substrate on a support, in which the substrate includes a silicon-containing film that includes a silicon oxide film, and a mask formed on the silicon-containing film, and a recess defined by a bottom and a side wall and having a first aspect ratio is formed in the silicon-containing film and the mask,
(b) forming a condensed or solidified layer of hydrogen fluoride (HF) at the bottom, by supplying a gas that includes HF,
(c) etching the bottom using plasma by supplying an electric bias to the support, to form a recess having a second aspect ratio higher than the first aspect ratio,
wherein the first aspect ratio is higher than an aspect ratio at which the condensed or solidified layer of HF is formed, and
during (b) and (c), a temperature of the substrate is maintained to be 0° C. or lower.

(A2) An etching method comprising
(a) providing a substrate on a support, in which the substrate includes a silicon-containing film that includes a silicon oxide film, and a mask with an opening having a first aspect ratio on the silicon-containing film,
(b) forming a condensed or solidified layer of hydrogen fluoride (HF) on the silicon-containing film, by supplying HF, and
(c) etching the silicon-containing film using plasma by supplying an electric bias to the support,
wherein the first aspect ratio is higher than an aspect ratio at which the condensed or solidified layer of HF is formed on the silicon-containing film, and
during (b) and (c), a temperature of the substrate is maintained to be 0° C. or lower.

(A3) An etching method defined in either (A1) or (A2), wherein the forming the condensed or solidified layer, plasma is formed by HF.

While the plasma etching apparatus of the present disclosure represents a capacitively coupled plasma (CCP) type plasma processing apparatus, other plasma processing apparatuses may be used. For example, inductively coupled plasma (ICP), radial line slot antenna (RLSA), electron cyclotron resonance plasma (ECR), or Helicon wave plasma (HWP) may be used.

According to an aspect, an etchant may be efficiently supplied to the bottom of an etching shape, so that the etching rate may be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma etching apparatus comprising:
a chamber;
a support for supporting a substrate in the chamber;
a gas supply containing hydrogen fluoride (HF) gas;
a plasma generator;
a cooler to cool the support; and
a controller having a processor and a memory with a computer readable program stored therein, the controller being configured to control the plasma etching apparatus to perform a process including:
controlling the gas supply to supply a processing gas into the chamber, the processing gas including the HF gas with a volume flow ratio of 30% or more with respect to a total flow rate of the processing gas;
controlling the plasma generator to generate a plasma from the processing gas in the chamber, to etch the substrate with the plasma to create an opening with an aspect ratio of 20 or more and to form a condensed or solidified layer of hydrogen fluoride at a bottom of the opening; and
controlling the cooler to maintain the support at 0° C. or lower during generation of the plasma.

2. The plasma etching apparatus according to claim 1, further comprising:
a pulsed direct current (DC) generator electrically connected to the support.

3. The plasma etching apparatus according to claim 1, further comprising:
a radio frequency (RF) generator electrically connected to the support.

4. The plasma etching apparatus according to claim 3, wherein the RF generator is configured to generate a RF power having 5 kW or more.

5. The plasma etching apparatus according to claim 3, wherein the processing gas is a mixed gas including the HF gas and another gas,
the RF generator supplies bias power to the support, such that ions in the plasma generated from the mixed gas reach the bottom of the opening to cause the condensed or solidified layer of hydrogen fluoride to react with an etching target film by the energy of the ions, so that the etching of the etching target film is accelerated and an anisotropic etching is performed on the etching target film.

6. The plasma etching apparatus according to claim 1, further comprising a controller configured to control the cooler to flow a heat transfer liquid through the support to maintain the support at 0° C. or lower during generation of the plasma.

7. The plasma etching apparatus according to claim 1, wherein the substrate includes at least one silicon-containing film selected from the group consisting of a silicon oxide film, a silicon nitride film, and a polysilicon film.

8. The plasma etching apparatus according to claim 1, wherein the substrate includes a stack having silicon oxide films and silicon nitride films formed in an alternating manner.

9. The plasma etching apparatus according to claim 1, wherein the substrate includes a silicon-containing film and a mask on the silicon-containing film, the mask includes at least one of carbon, silicon or a metal.

10. The plasma etching apparatus according to claim 1, wherein the substrate includes a silicon-containing film and a mask on the silicon-containing film, the mask includes at least one metal selected from the group consisting of tungsten, titanium, molybdenum, ruthenium, hafnium and aluminum.

11. The plasma etching apparatus according to claim 1, wherein the processing gas further includes a fluorocarbon gas.

12. The plasma etching apparatus according to claim 1, wherein the processing gas further includes a halogen containing gas.

13. The plasma etching apparatus according to claim 12, wherein the halogen containing gas includes $Cl_2$ and/or HBr.

14. The plasma etching apparatus according to claim 1, wherein the plasma etching apparatus is one of: a capacitively coupled plasma (CCP) apparatus, an inductively coupled plasma (ICP) apparatus, a radial line slot antenna (RLSA) apparatus, an electron cyclotron resonance plasma (ECR) apparatus, or a Helicon wave plasma (HWP) apparatus.

15. A plasma etching apparatus comprising:
a chamber;
a support in the chamber;
a gas supply containing hydrogen fluoride (HF) gas;
a plasma generator;
a cooler; and
a controller having a processor and a memory with a computer readable program stored therein, the controller being configured to control the plasma etching apparatus to perform a process including:
(a) placing a substrate on the support in the chamber;
(b) supplying a processing gas into the chamber by the gas supply, the processing gas including the HF gas with a volume flow ratio of 30% or more with respect to a total flow rate of the processing gas;
(c) generating a plasma from the processing gas to etch the substrate with the plasma to create an opening with an aspect ratio of 20 or more and to form a condensed or solidified layer of hydrogen fluoride at a bottom of the opening; and
(d) during (b) and (c), maintaining the substrate at 0° C. or lower.

16. The plasma etching apparatus according to claim 15, wherein the second processing gas further includes $Cl_2$ and/or HBr.

17. The plasma etching apparatus according to claim 15, wherein the processing gas is a mixed gas including the HF gas and another gas, and
the plasma etching apparatus further includes an RF generator to supply bias power to the support, such that ions in the plasma generated from the mixed gas reach the bottom of the opening to cause the condensed or solidified layer of hydrogen fluoride to react with an etching target film by the energy of the ions, so that the etching of the etching target film is accelerated and an anisotropic etching is performed on the etching target film.

18. A plasma etching apparatus comprising:
a chamber;
a support in the chamber;
a gas supply containing hydrogen fluoride (HF) gas;
a plasma generator;
a cooler; and
a controller having a processor and a memory with a computer readable program stored therein, the controller being configured to cause:
(a) placing a substrate on the support in the chamber;
(b) providing a first process comprising:
(b1) supplying a first processing gas into the chamber by the gas supply; and
(b2) generating a first plasma from the first processing gas to etch the substrate with the first plasma;
(c) providing a second process comprising:
(c1) supplying a second processing gas into the chamber by the gas supply, the second processing gas being different from the first processing gas, the second processing gas including the hydrogen fluoride (HF) gas with a volume flow ratio of 30% or more with respect to a total flow rate of the second processing gas; and
(c2) generating a second plasma from the second processing gas to etch the substrate with the second plasma to create an opening with an aspect ratio of 20 or more and to form a condensed or solidified layer of hydrogen fluoride at a bottom of the opening; and
(d) during (b) and (c), maintaining the substrate at 0° C. or lower.

19. The plasma etching apparatus according to claim 18, wherein the first processing gas comprises fluorine, and
wherein the controller is further configured to cause:
providing a bias power to the support during at least one of the first process or the second process.

20. The plasma etching apparatus according to claim 18, wherein the second processing gas further includes $Cl_2$ and/or HBr.

* * * * *